United States Patent [19]

Ho

[11] 4,321,527
[45] Mar. 23, 1982

[54] APPARATUS AND METHOD FOR INDIVIDUALLY TESTING COMBINED ACTIVE ELEMENTS

[75] Inventor: Pang T. Ho, Mountain View, Calif.

[73] Assignee: Ford Aerospace & Communications Corp., Detroit, Mich.

[21] Appl. No.: 75,923

[22] Filed: Sep. 17, 1979

[51] Int. Cl.³ .......................................... G01R 27/04
[52] U.S. Cl. ................................................. 324/58 A
[58] Field of Search .................... 324/58 A, 57 R, 84, 324/58.5 A

[56] References Cited

U.S. PATENT DOCUMENTS

| | | | |
|---|---|---|---|
| 3,439,266 | 4/1969 | Rogers | 324/58 A |
| 3,474,336 | 10/1969 | Alford | 324/58 A |
| 3,492,569 | 1/1970 | Sontheimer | 324/58 A |
| 3,517,309 | 6/1970 | Gerst | 324/84 |
| 3,522,526 | 8/1970 | Sanderson . | |
| 3,566,286 | 2/1971 | Freeman | 324/57 R X |
| 3,711,769 | 1/1973 | Peake . | |
| 3,789,301 | 1/1974 | Malaviya . | |
| 3,956,695 | 5/1976 | Stamm | 324/58.5 A |
| 4,104,583 | 8/1978 | Engen . | |

Primary Examiner—Stanley T. Krawczewicz
Attorney, Agent, or Firm—Edward J. Radlo; Robert D. Sanborn; Clifford L. Sadler

[57] ABSTRACT

This device enables one to perform individual measurements, tests, and tuning of active elements in a circuit in which the active elements are combined using couplers. Typically, the active elements are amplifiers which are power combined using quadrature power dividers and combiners. The invention uses two additional quadrature couplers, one at the front and one at the back of the circuit. All the power is introduced into one input port of the first additional coupler. The action of the first two couplers results in power flowing through one of the active elements only. The action of the second pair of couplers results in the flow of power through one output port only. After testing, the additional couplers are removed. The invention enables the one step fabrication of components on the substrate followed by testing, rather than the more time consuming and complex separate assembly and testing of four substrates.

12 Claims, 2 Drawing Figures

APPARATUS AND METHOD FOR INDIVIDUALLY TESTING COMBINED ACTIVE ELEMENTS

BACKGROUND OF THE INVENTION

1. Field of the Invention:

This invention is an apparatus and a method for individually testing, measuring, and tuning a pair of active elements such as transistors that are paralleled in a circuit by means of quadrature couplers.

2. Description of the Prior Art:

U.S. Pat. No. 3,474,336 is a circuit for testing device X32 in conjunction with standard II 26 simultaneously. Hybrids A and B are employed; but no extra couplers are used as in the present invention, which is capable of testing parallel active devices independently and separately.

U.S. Pat. No. 3,711,769 tests unit 3 by removing the pure component of its output signal, leaving a spurious signal at the output of amplifier balance adjustment 5. The reference does not suggest the present invention.

U.S. Pat. No. 3,789,301 uses directional couplers, but only in conjunction with a single active device, to measure the parameters of the device at microwave frequencies.

Secondary references are U.S. Pat. Nos. 3,522,526 and 4,104,583.

None of the above references shows an apparatus and a method for independently measuring active elements that are paralleled via quadrature couplers.

SUMMARY OF THE INVENTION

The present invention enables one to test individually active elements that are combined in parallel via quadrature couplers. The invention has particular applicability to microwave circuits, because at high radio frequencies the assembly of a circuit on a substrate is a time consuming and cost limiting process. Therefore, it is desirable to keep the assembly time and complexity as low as possible. The present invention accomplishes this by enabling the circuit designer to fabricate all the components of the circuit on a single substrate prior to testing, followed by testing of the active components in the circuit separately and independently, as well as any necessary tuning of these components. The prior art, on the other hand, forced the designer to separately fabricate and then test a number of substrates. For the embodiment discussed further in this application, four separate fabrication steps were necessary versus one of the present invention.

The typical device to be tested in this invention is a high power solid state amplifier. High power solid state devices are notorious for circuit loading sensitivity and poor device-to-device uniformity. In order to optimize the amplifier performance, individual circuit alignment is necessary to achieve optimum performance. In addition, during the power combination, the amplitude and phase of the combined amplifiers have to be well matched to maximize the power combining efficiency. The balance requirement creates another need to measure the amplifiers' performance individually.

The present invention has applicability for "hybrid" circuits, i.e., where active and passive components are made separately and then assembled on the same substrate. It has even greater advantages for "monolithic" circuits, i.e., where the active and passive components are fabricated simultaneously upon the same substrate.

In essence, the present invention utilizes an additional quadrature (90° phase shift) coupler at the front end of the circuit. This results in no power flowing to one of the active elements in the circuit. A second coupler is added to the circuit at its back end. This results in all the power exiting from one output port, with all voltage components at this port being in phase.

Measurements, tests, and tunings are performed on one active element separately. Then the input power is directed through the other input port, providing for the separate measuring, testing, and tuning of the other active element in the circuit. The extra couplers are then removed from the circuit for subsequent reuse.

BRIEF DESCRIPTION OF THE DRAWINGS

These and other more detailed and specific objects and features of the present invention are more fully disclosed in the following specification, reference being had to the accompanying drawings, in which.

DESCRIPTION OF THE PREFERRED EMBODIMENTS

Figure 1:
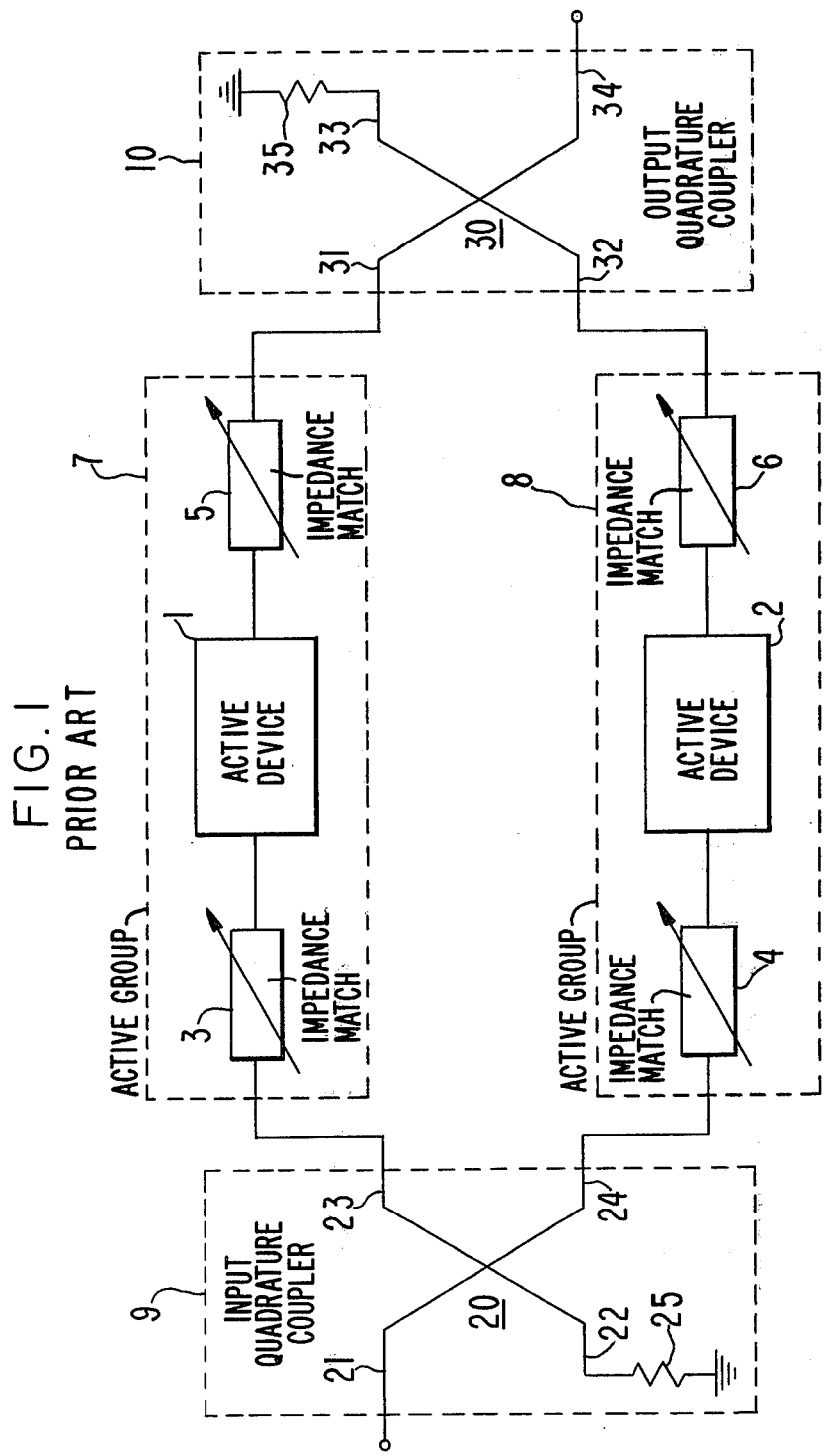
FIG. 1 is a schematic diagram of the prior art circuit showing the spearation of substrates necessary for fabrication.

FIG. 1 illustrates the type of circuit which can be tested by the present invention as well as the method of the prior art for testing such a circuit. Active elements 1 and 2 are connected in parallel via couplers 20 and 30. Elements 1 and 2 can be any active device such as bipolar transistors, FET's, diodes, etc. They typically act as power-combined amplifiers. Associated at the input and output of each of the active elements are impedance matching networks 3 and 5 (associated with active element 1) and impedance matching networks 4 and 6 (associated with active element 2). Together, element 1, network 3 and network 5 constitute active group 7. Similarly, together, element 2, its associated input impedance matching network 4, and its associated output impedance matching network 6 constitute active group 8. Groups 7 and 8 are typically fabricated simultaneously on the same substrate.

Connected to each of groups 7 and 8 is input power combining coupler 20 which is a quadrature coupler, i.e., the voltage phase angle at output port 24 lags the voltage phase angle at output port 23 by 90°. Coupler 20 can have any design, such as an interdigitated coupler or a branch line coupler. Power introduced at port 21 is divided between ports 23 and 24 according to the power division ratio (hereinafter "power ratio") of coupler 20. A power ratio of 0.6, for example, means that 0.6 of the input power at port 21 will appear at output port 24 (the cross port) and 0.4 of the input power appearing at input port 21 will appear at output port 23 (the opposing port). As used in this patent application, the power ratio is that fraction of the input power which is transported to the cross port of the coupler; the fraction of power which is transported to the opposing output port is equal to 1 minus the power ratio of the coupler.

A phase shift of minus 90° (all the couplers discussed herein are quadrature, or 90°, couplers) plus the constant phase shift introduced by the coupler into each output port is introduced into that voltage which crosses a cross branch of the coupler; in coupler 20, the voltage phase appearing at output port 24 will lag by 90° the voltage phase appearing at output port 23.

Resistor 25, equal to the characteristic impedance of the coupler, which is typically but not necessarily 50 ohms, is connected between port 22 (an isolate port) and ground. The first output port, port 23, is connected to the input impedance matching network 3 of the first active group 7, and the second output port, port 24, is connected to the input impedance matching network 4 of the second active group 8. Because the input coupler 20 is a quadrature or a 90° coupler, the voltage through group 7 will be 90° in advance of the voltage in group 8. Typically, groups 7 and 8 introduce phase shifts of their own into the circuit. These are usually equal. If they are not equal, they can be made equal by insertion of a phase shifter (not shown) in one of the lines between the input coupler 20 and output coupler 30.

Output coupler 30 has its input ports 31 and 32 connected to the output impedance matching networks 5 and 6 of groups 7 and 8, respectively, as shown in FIG. 1. Coupler 30 is also a quadrature (90°) coupler. Connected between output port 33 and ground is resistor 35, having a resistance equal to the characteristic impedance of coupler 30, which is typically but not necessarily 50 ohms. Couplers 20 and 30 may or may not be 3 db hybrid couplers, i.e., couplers having a power ratio of 0.5.

Figure 2:
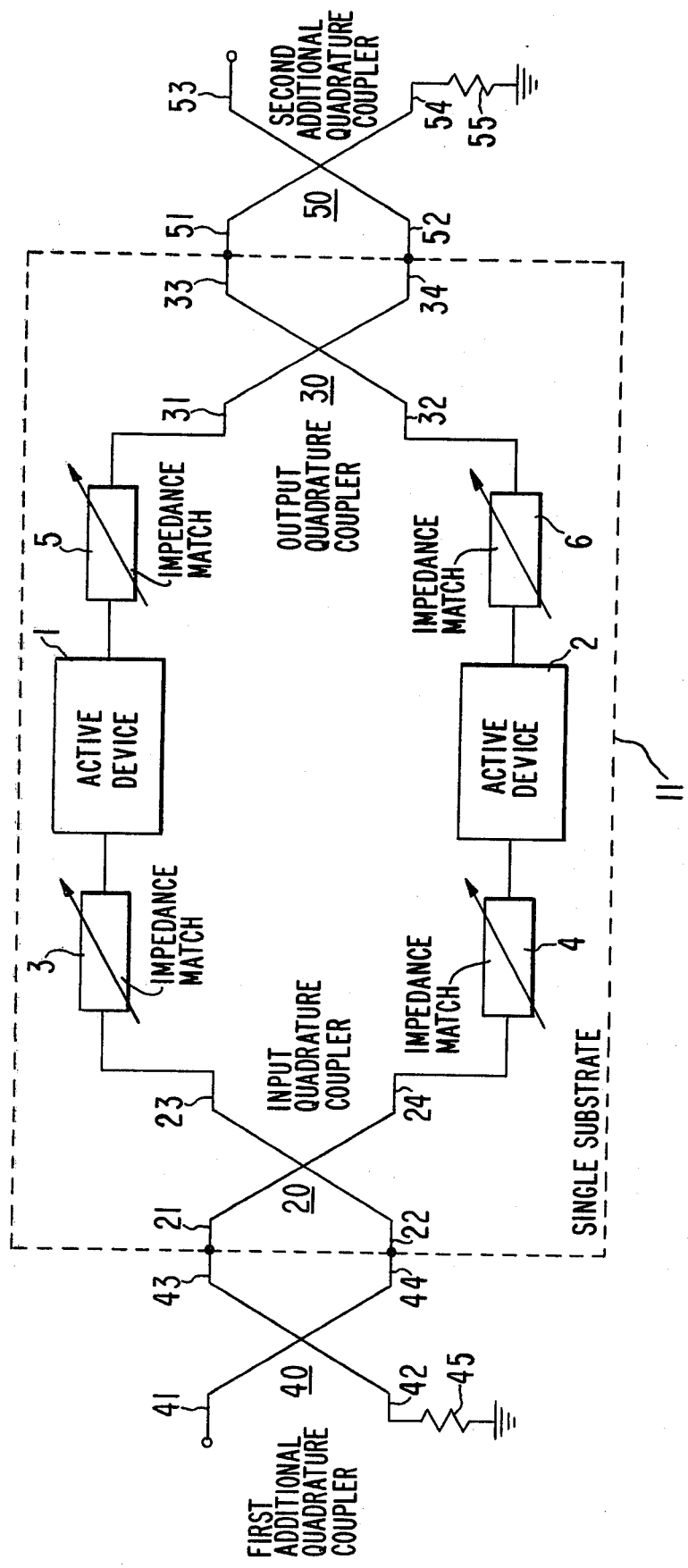
FIG. 2 is a schematic diagram showing a preferred embodiment of the present invention.

The present invention addresses the problem of testing and tuning the elements of groups 7 and 8, e.g., by adjusting the impedance of impedance matching networks 3, 4, 5, and 6. In the prior art each of groups 7 and 8 is fabricated on separate substrates. Similarly, couplers 20 and 30 with associated resistors 25 and 35, respectively, are fabricated on separate substrates 9 and 10. Thus, four separate substrate fabrication steps are required, which is expensive. After the individual substrates are fabricated and tested, the four substrates are connected together. The present invention remedies this problem of complex and time consuming assembly by enabling the circuit designer to manufacture all of the above components (less resistors 25 and 35) simultaneously on single substrate 11 (see FIG. 2). Then active elements 1 and 2 are tested separately after the fabrication step.

In the present invention, an additional coupler 40 is connected to input coupler 20, with port 43 connected to port 21 and port 44 connected to port 22. Similarly, an additional output coupler 50 is connected to output coupler 30, with port 51 connected to port 33 and port 52 connected to port 34. Each of these couplers is a quadrature (90°) coupler. A resistance 45 is connected between isolate port 42 of coupler 40 and ground. The value of resistance 45 is equal to the characteristic impedance of the coupler, which is typically but not necessarily 50 ohms. Similarly, resistor 55 is connected between output port 54 of additional output coupler 50 and ground. The value of resistance 55 is equal to the characteristic impedance of coupler 50, which is typically but not necessarily 50 ohms.

To test active device 2, all the input power is applied at port 41 with device 1 not d.c. biased; all the input power minus the insertion loss of couplers 40 and 20 appears at output port 24 of coupler 20. No power exits through output port 23 and into network 3 because the two components of the signal entering into this path are equal in magnitude but 180° out of phase; therefore, they cancel. Thus no power enters into element 1 and element 2 can be tested and tuned independently thereof.

As a further refinement to the invention, the combined action of couplers 30 and 50 serves to place at output port 53 an amount of power equal to all the power appearing at port 32 minus the insertion loss due to couplers 30 and 50. The two voltage components which are present at port 54 are 180° out of phase and thus cancel. This facet of the invention enables meaningful measurements to be made solely at output port 53.

To test active device 1, resistors 45 and 55 are removed from ports 42 and 54 respectively, and are connected between port 41 and ground and between port 53 and ground, respectively. The input power is now applied at port 42, element 2 not being d.c. biased, and all of the output power is measured at port 54. The only active device which is operational during this mode is active device 1 because the two voltage components appearing at port 24 are equal in amplitude and are 180° out of phase and thus they cancel and no power flows through device 2. Similarily, the two voltage components at port 53 are equal in amplitude and 180° out of phase and thus they cancel.

After the above procedure, couplers 40 and 50 are disconnected from substrate 11 for subsequent reuse elsewhere.

The couplers do not have to be hybrid (3 db) couplers. For example, it might be desirable to use other power ratios for couplers 20 and/or 30 because of different gain characteristics of active devices 1 and 2. If the power ratio of coupler 20 is D, the invention will work if the power ratio of coupler 40 is $(1-D)$. Similarly, if the power ratio of coupler 30 is G, the invention will work if the power ratio of coupler 50 is $(1-G)$.

Let us illustrate the operation of the invention when a power ratio other than 0.5 is employed. Let us assume that the power ratio of coupler 20 is 0.4; this means that the power transported across a cross branch of the coupler will be 0.4 times the input power applied to the coupler, and the power appearing at the opposing output port will be 0.6 times the input power. For example, if power X appears at port 21, 0.4X will appear at port 24 and 0.6X will appear at port 23. The phase of the voltage appearing at port 24 will be 90° behind the phase of the voltage appearing at port 23.

In this example, the invention will work if the power ratio of coupler 40 is 0.6. Let us assume that the normalized impedance is 1 and that power P (voltage $V=\sqrt{P}$) is applied at port 41. No power is applied at port 42. $\theta$ is the constant phase shift introduced by coupler 40 and $\beta$ is the constant phase shift introduced by coupler 20. By the action of coupler 40, 0.6P ($\sqrt{0.6}$ V at angle $\theta-90°$) will appear at ports 44 and 22, and 0.4P ($\sqrt{0.4}$ V at angle $\theta$) will appear at ports 43 and 21. Note that the voltage phase at ports 44 and 22 is 90° behind the voltage phase at ports 43 and 21. By the action of coupler 20, with respect to the power at port 21, 0.24P ($\sqrt{0.24}$ V at angle $\theta+\beta$) appears at port 23 and 0.16P (0.4 V at angle $\theta+\beta-90°$) appears at port 24. With respect to the power appearing at port 22, 0.24P ($\sqrt{0.24}$ V at angle $\theta+\beta-180°$) will appear at port 23 and 0.36P (0.6 V at an angle of $\theta+\beta-90°$) will appear at port 24. The voltages at port 24 are in phase and thus additive; therefore, power P (voltage V at angle $\theta+\beta-90°$) will appear at port 24. Since the voltage components at port 23, on the other hand, are equal in amplitude and 180° out of phase, no power will appear at port 23.

Similarily, let us assume that coupler 30 has been designed to have a power ratio of 0.6 to compensate for differing gain characteristics of elements 1 and 2. The invention will work if the power ratio of coupler 50 is set at 0.4. $\gamma$ is the constant phase shift introduced by coupler 30 and $\alpha$ is the constant phase shift introduced by coupler 50. Let us assume that the normalized impedance is 1 and a power A (voltage W) at 0° voltage phase appears at port 32. (No power appears at port 31 for an ideal coupler.) By the action of coupler 30, 0.6A ($\sqrt{0.6}$ W at angle $\gamma - 90°$) appears at ports 33 and 51 and 0.4A ($\sqrt{0.4}$ W at angle $\gamma$) appears at ports 34 and 52. The effect of coupler 50 is as follows: with respect to the power at port 51, 0.36A (0.6 W at angle $\gamma + \alpha - 90°$) appears at port 53 and 0.24A ($\sqrt{0.24}$ W at angle $\gamma + \alpha - 180°$) appears at port 54. With respect to the power appearing at port 52, 0.16A (0.4 W at angle $\gamma + \alpha - 90°$) will appear at port 53, and 0.24A ($\sqrt{0.24}$ W at angle $\gamma + \alpha$) will appear at port 54. The voltage components at port 53 are in phase and thus power A (voltage W at angle $\gamma + \alpha - 90°$) will appear at port 53. On the other hand, the voltage components appearing at port 54 are 180° out of phase with the same amplitude and therefore they cancel and no current flows through resistor 55.

The above description is included to illustrate the operation of the preferred embodiments and is not meant to limit the scope of the invention. The scope of the invention is to be limited only by the following claims. From the above discussion, many variations will be apparent to one skilled in the art that would yet be encompassed by the spirit and scope of the invention.

What is claimed is:

1. Apparatus for independently testing two active components each connected to an input quadrature coupler and an output quadrature coupler, comprising:
   a first additional quadrature coupler, connected to said input coupler.

2. Apparatus of claim 1 further comprising:
   a second additional quadrature coupler, connected to said output coupler.

3. Apparatus as in claim 2 wherein:
   the power ratio of said input coupler is J;
   the power ratio of said first additional coupler is $(1-J)$;
   the power ratio of said output coupler is K; and
   the power ratio of said second additional coupler is $(1-K)$.

4. The apparatus of claim 2 wherein:
   each of said four couplers has two input ports and two output ports;
   the two output ports of said first additional coupler are connected to the two input ports, respectively, of said input coupler;
   the two output ports of said input coupler are connected to the two active components, respectively, at an input end of each;
   the two input ports of said output coupler are connected to the two active components, respectively, at an output end of each; and
   the two output ports of said output coupler are connected to the two input ports, respectively, of said second additional coupler.

5. Apparatus as in claim 4 wherein a resistance equal to the characteristic impedance of said first additional coupler is connected between one input port of said first additional coupler and ground; and
   a resistance equal to the characteristic impedance of said second additional coupler is connected between one output port of said second additional coupler and ground.

6. Apparatus as in claim 5 wherein a test input signal is applied to that input port of said first additional coupler not connected via a resistor to ground.

7. Method for individually testing two active devices that are parallel connected via an input quadrature coupler and an output quadrature coupler comprising:
   connecting a first additional quadrature coupler to said input coupler; and
   applying a test input signal to an input port of said first additional coupler.

8. Method as in claim 7 further comprising the additional steps of:
   connecting a second additional quadrature coupler to said output coupler; and
   measuring the output signal to an output port of said second additional coupler.

9. Method of claim 8 wherein:
   the power ratio of said input coupler is J;
   the power ratio of said first additional coupler is $(1-J)$;
   the power ratio of said output coupler is K; and
   the power ratio of said second additional coupler is $(1-K)$.

10. The method of claim 8 wherein each coupler has two input ports and two output ports and further comprising the additional steps of:
    connecting a resistor between the nonsignalled input port of said first additional coupler and ground; and
    connecting a resistor between the nonmeasured output port of said second additional coupler and ground.

11. Method as in claim 10 further comprising the additional steps of:
    reversing the resistance-connected input port and the signalled input port of said first additional coupler; and
    reversing the resistance-connected output port and the measured output port of said second additional coupler.

12. Method as in claim 8 further comprising the additional step of disconnecting the first additional coupler and the second additional coupler from said input and output couplers, respectively.

* * * * *